US 6,532,425 B1

(12) United States Patent
Boost et al.

(10) Patent No.: US 6,532,425 B1
(45) Date of Patent: Mar. 11, 2003

(54) REMOTE BATTERY PLANT MONITORING SYSTEM

(75) Inventors: Mike Boost, Tucson, AZ (US); Jean Bizouard, Tucson, AZ (US)

(73) Assignee: C&D Charter Holdings, Inc., Wilmington, DE (US)

( * ) Notice: Subject to any disclaimer, the term of this patent is extended or adjusted under 35 U.S.C. 154(b) by 0 days.

(21) Appl. No.: 09/398,587

(22) Filed: Sep. 17, 1999

Related U.S. Application Data

(60) Provisional application No. 60/100,940, filed on Sep. 18, 1998.

(51) Int. Cl.[7] ............................ G01R 31/36; H02J 7/00; G01N 27/416
(52) U.S. Cl. .................... 702/63; 320/134; 320/136; 324/431; 324/434
(58) Field of Search ................ 320/116–126, 132–136, 320/148–154; 324/426–437; 702/60–65; 700/297, 298

(56) References Cited

U.S. PATENT DOCUMENTS

| | | | |
|---|---|---|---|
| 4,217,645 A | | 8/1980 | Barry et al. ............... 364/483 |
| 5,047,961 A | * | 9/1991 | Simonsen .................. 702/63 |
| 5,321,626 A | * | 6/1994 | Palladino ................... 702/63 |
| 5,321,627 A | * | 6/1994 | Reher ........................ 702/63 |
| 5,565,759 A | * | 10/1996 | Dunstan ..................... 320/48 |
| 5,592,094 A | * | 1/1997 | Ichikawa .................... 324/427 |
| 5,606,242 A | * | 2/1997 | Hull et al. ................... 320/106 |
| 5,631,540 A | * | 5/1997 | Nguyen ...................... 320/30 |
| 5,652,502 A | * | 7/1997 | van Phuoc et al. ........... 702/63 |
| 5,661,463 A | | 8/1997 | Letchak et al. ............. 340/636 |
| 5,675,234 A | | 10/1997 | Greene ........................ 320/15 |
| 5,705,929 A | | 1/1998 | Caravello et al. ........... 324/430 |
| 5,754,868 A | * | 5/1998 | Yamamoto et al. ......... 713/300 |
| 5,796,239 A | * | 8/1998 | van Phuoc et al. ......... 320/107 |
| 5,808,445 A | * | 9/1998 | Aylor et al. ................. 320/132 |

* cited by examiner

*Primary Examiner*—Maria N. Von Buhr
(74) *Attorney, Agent, or Firm*—Hoffmann & Baron, LLP

(57) ABSTRACT

A system for monitoring performance of one or more batteries in a battery plant facility. A set of sensors for each battery are used to measure a plurality of battery operation parameters comprising the battery current, battery voltage, and internal battery temperature of each said battery. A processor generates, for each battery, a plurality of battery status parameters comprising a true age parameter and a float capacity parameter. During a float period, the true age parameter is updated based on elapsed time corrected for battery temperature history and the float capacity is updated based on the most recent true age parameter. During a discharge period, the float capacity parameter is updated based on the evolution of plant voltage during the discharge. After the discharge period, at the beginning of a subsequent float period, the true age parameter is updated based on the float capacity parameter determined during the immediately previous discharge period.

23 Claims, 13 Drawing Sheets

Status: Temp Differences & Aux Voltages

Print/Exit

|  | String 1 | String 2 | String 3 | String 4 |
|---|---|---|---|---|
| Present Conditions: | | | | |
| Ambient Temp. | 87.1 | | | |
| Pilot Cell Temp. | 81.7 | 84.8 | 82.3 | 69.0 |
| Second Cell Temp. | 86.4 | 93.8 | 96.8 | 91.4 |
| Cell Maximums: | | | | |
| High Cell Temperature | 87 | 94 | 97 | 91 |
| Low Cell Temperature | 67 | 67 | 67 | 67 |
| Differences: | | | | |
| High Cell Temperature | -4.8 | -9.0 | -14.5 | -22.3 |
| Low Cell Temperature | -5.4 | -2.3 | -4.8 | -18.0 |
| Low Cell Temperature | -0.7 | 6.7 | 9.7 | 4.3 |

Aux # 1 Voltage  0.1   Aux # 2 Voltage  0.0   [OK]

*800* FIG. 8

| Status: Computed Values | | | | |
|---|---|---|---|---|
| Computed Values | String 1 | String 2 | String 3 | String 4 |
| Est. Reserve Time During Float (Hrs) | 9.00 | 9.00 | 9.00 | 9.00 |
| Est. Reserve Time During Discharge (Hrs) | 2.60 | 6.80 | 1.70 | 2.00 |
| Battery Age Based on Discharge Est. (Yrs) | 0.00 | 0.00 | 0.00 | 0.00 |
| Probability of Imm./ Sudden Failure (%) | 0 | 0 | 0 | 0 |
| Accumulated Depth of Discharge | 60 | 20 | 81 | 73 |

1100  FIG. 11

| Configure: Major/Minor Alarm Trigger | | | | | | | | |
|---|---|---|---|---|---|---|---|---|
| Print/Exit  Selections | | | | | | | | |
| | | MAJOR | | | | MINOR | | |
| For Plant or Any String: | OR | AND 1* | AND 2* | AND 3* | OR | AND 1* | AND 2* | AND 3* |
| Pilot to Second Cell Difference | ■ | ☐ | ☐ | ☐ | ☐ | ☐ | ☐ | ☐ |
| Pilot to Ambient Difference | ■ | ☐ | ☐ | ☐ | ☐ | ☐ | ☐ | ☐ |
| Second Cell to Ambient Difference | ■ | ☐ | ☐ | ☐ | ☐ | ☐ | ☐ | ☐ |
| High Cell Temperature | ■ | ☐ | ☐ | ☐ | ☐ | ☐ | ☐ | ☐ |
| Low Cell Temperature | ☐ | ☐ | ☐ | ☐ | ■ | ☐ | ☐ | ☐ |
| Ambient Maximum | ☐ | ☐ | ☐ | ☐ | ■ | ☐ | ☐ | ☐ |
| Ambient Minimum | ☐ | ☐ | ☐ | ☐ | ■ | ☐ | ☐ | ☐ |
| Maximum Charge Current | ☐ | ☐ | ☐ | ☐ | ☐ | ☐ | ☐ | ☐ |
| Maximum Float Current | ☐ | ■ | ☐ | ☐ | ☐ | ☐ | ☐ | ☐ |
| Maximum Total Current | ☐ | ☐ | ☐ | ☐ | ☐ | ☐ | ☐ | ☐ |
| Maximum Battery Voltage | ■ | ☐ | ☐ | ☐ | ☐ | ☐ | ☐ | ☐ |
| Low Voltage Disconnect Voltage | ■ | ☐ | ☐ | ☐ | ☐ | ☐ | ☐ | ☐ |
| Low Voltage Reconnect Voltage | ☐ | ☐ | ☐ | ☐ | ☐ | ☐ | ☐ | ☐ |
| Max. Midpoint Voltage Deviation | ☐ | ■ | ☐ | ☐ | ■ | ☐ | ☐ | ☐ |
| Min. Reserve Time at Float | ■ | ☐ | ☐ | ☐ | ☐ | ☐ | ☐ | ☐ |
| Min. Reserve Time During Disch. | ■ | ☐ | ☐ | ☐ | ☐ | ☐ | ☐ | ☐ |
| Maximum Battery Age Acceptable | ☐ | ☐ | ☐ | ☐ | ■ | ☐ | ☐ | ☐ |
| % Prob. of Imm./Sudden Failure | ☐ | ☐ | ☐ | ☐ | ■ | ☐ | ☐ | ☐ |
| Aux. #1 Analog Voltage Input | ☐ | ☐ | ☐ | ☐ | ☐ | ☐ | ☐ | ☐ |
| Aux. #2 Analog Voltage Input | ☐ | ☐ | ☐ | ☐ | ☐ | ☐ | ☐ | ☐ |

Buttons: Select All MAJORS, Clear All MAJORS, Select All MINORS, Clear All MINORS, Restore Defaults, OK, None ▽, RESET LOG

* Changing any AND selection invalidates BSMCs Alarm Log Memory. Suggest you RESET BSMC Log memory.

1200      FIG. 12

| Status: Latest Alarms | | | | | | |
|---|---|---|---|---|---|---|
| Print/Exit | | | | | | |

Latest Alarms     PgUp = Up 10 Lines    Ctrl + PgUp = Top
                     PgDwn = Dwn 10 Lines   Ctrl + PgDwn = Bottom

| Event # | Alarm Description | Kind | Logic | Date | Time | Action |
|---|---|---|---|---|---|---|
| 17 | Pilot to Second Cell Difference | Major | OR | 7-7-1998 | 1:28:23 PM | ON |
| 16 | Maximum Battery Voltage | Plant | LVD | 7-7-1998 | 1:28:05 PM | OFF |
| 15 | Maximum Battery Voltage | Plant | BD-S4 | 7-7-1998 | 1:28:05 PM | OFF |
| 14 | Maximum Battery Voltage | Plant | BD-S3 | 7-7-1998 | 1:28:05 PM | OFF |
| 13 | Maximum Battery Voltage | Plant | BD-S2 | 7-7-1998 | 1:28:05 PM | OFF |
| 12 | Maximum Battery Voltage | Plant | BD-S1 | 7-7-1998 | 1:28:05 PM | OFF |
| 11 | Maximum Battery Voltage | Aux | OR | 7-7-1998 | 1:28:05 PM | OFF |
| 10 | Maximum Battery Voltage | Minor | OR | 7-7-1998 | 1:28:05 PM | OFF |
| 9 | Maximum Battery Voltage | Major | OR | 7-7-1998 | 1:28:05 PM | OFF |
| 8 | Maximum Battery Voltage | Plant | LVD | 7-7-1998 | 1:28:01 PM | ON |
| 7 | Maximum Battery Voltage | Plant | BD-S4 | 7-7-1998 | 1:28:01 PM | ON |

17 Total Alarms    RESET  Use RESET to clear above listing not BSMC!    OK

1300     FIG. 13

REMOTE BATTERY PLANT MONITORING SYSTEM

CROSS-REFERENCES TO RELATED APPLICATIONS

This nonprovisional U.S. national application, filed under 35 U.S.C. §111(a), claims, under 37 C.F.R. §1.78(a)(3), the benefit of the filing date of provisional U.S. national application No. 60/100,940, filed on Aug. 18, 1998 under 35 U.S.C. §111(b), the entirety of which is incorporated herein by reference.

BACKGROUND OF THE INVENTION

1. Field of the Invention

The present invention relates to DC battery backup systems and, in particular, to monitoring such systems to predict battery health and functionality.

2. Description of the Related Art

Many facilities, sites, or types of equipment are normally powered from the external AC commercial power grid. Often, such sites use batteries as an emergency backup power supply to provide power to equipment or other devices at the site in case of an AC power supply failure. The backup batteries and associated equipment are sometimes referred to as a DC power plant or battery plant.

Each such battery plant typically includes one or more battery strings, often coupled in parallel. Each battery string typically includes a number of series-connected rechargeable cells. The general term "battery" may also be used to refer to batteries such as battery strings. The AC power typically is converted to DC with a rectifier. The DC power is used to keep the battery string charged (known as a float-charge operation) and also to power various equipment such as telephone switching equipment. The battery terminals are thus directly coupled in parallel with the output of the rectifier and with the input terminals to the equipment requiring DC power.

Thus, so long as AC power is provided to the rectifier, it provides DC power to power the equipment and also to keep the battery strings continually charged (called a float charge operation or condition), or to recharge them after a discharge. If AC power is lost, the DC battery strings immediately begin discharging and power the equipment. Such battery backup systems are sometimes referred to as "uninterruptible power supplies" because the battery system immediately supplies the necessary energy upon loss of AC power. These systems are usually designed so that the load is never aware of the AC power failure, as long the backup DC power is provided as expected by the battery plant.

In order to provide services to rural areas, telecommunications equipment is often deployed in small facilities such as cabinets and controlled environmental enclosures, sometimes referred to as outside plant (OP) power system sites. These sites are typically unmanned and remote from the central office (CO). Lead acid "wet" cell batteries are often used in COs but valve-regulated lead acid or "dry" batteries have become the dominant type of battery used at remote OPs, because they are sealed (no water) and have lower maintenance. Such dry batteries also have less power and are typically more expensive than more maintenance-requiring wet cells. A 24-cell dry cell battery typically provides 48V.

A new dry cell battery is typically designed to last 10–20 years, but may only last 2–3 years if a problem (e.g. corrosion or short-circuited cell) develops. This may be due to misuse, too-high temperatures, etc. In addition to prematurely short life of such batteries, dry cell batteries and other batteries often experience unexpected failures and general capacity loss, and thus require many unplanned and costly service calls.

In many applications, it is critical that the batteries of the power plant be functional and ready to supply sufficient backup power if AC power is lost. For example, a battery plant may be designed and expected to provide an 8-hour discharge. If, however, the battery has an unknown problem and only lasts one hour when AC power goes out, telephone service may drop out after one hour and may not be restored for the several hours it takes power to be restored. Or, if a battery string is supposed to last a given time (e.g. 20 years) and will normally be replaced at some battery age close to but before the expiration time (e.g., at 19 years), a prematurely aged battery may not be replaced in time (e.g., a battery may have an effective or "true" age of 20 years after only 5 years of service due to various factors such as prolonged high operating temperatures).

Thus, it is important to monitor battery strings of a given battery plant to predict battery failure and other battery performance or status parameters or measures related to battery health or performance, so that action can be taken ahead of time to ensure that the problem is addressed, i.e. to ensure that the battery strings will perform as expected upon loss of AC power and to ensure that the batteries are adequately maintained, inspected, replaced, and the like.

Some causes of impending failure are relatively easy to detect, such as grid corrosion, short circuits in cells, post leaks, excess buildup on the negative plates, and the like. However, some of these causes may only be detected if a complete inspection is made as part of a site visit. Many types of battery monitoring equipment and techniques can predict battery health only with on-site manual application and testing. Such routine site visits can be cost-prohibitive and impractical.

Load discharge tests can be used, for example, to test a battery system's ability to perform (health). However, such discharge tests reduce the remaining service life of a battery and may cause deterioration which can impair the battery's ability subsequently.

Human personnel may also take periodic electrolyte specific gravity measurements of wet cells and may conduct visual and other checks to determine battery status. However, in systems employing sealed or dry cells, the measurement of specific gravity is not practical. Moreover, such readings are not completely reliable indicators of a battery string's functionality.

The measurement of the open circuit voltage may also be employed, but requires disconnection from the system for 24 hours and has other disadvantages.

"Intrusive" tests such as conductive and impedance testing has also been used to try to predict battery failure. The required equipment is expensive, however, and must be used at the site to measure each battery string on a cell-by-cell basis. Thus, such battery testing techniques are intrusive and require a labor-intensive site visit, which increases expense and also means that there cannot be continuous testing or monitoring of the battery strings. In addition, the results of such tests are not 100% accurate.

Some battery monitors integrate directly into the power plant and continuously and automatically monitor a battery system without manual action. In order to be accurate, such equipment must be very advanced, intrusive, and expensive. Alternatively, if simpler and cheaper testing techniques are utilized, the results are much less accurate.

There is a need, therefore, for a low-maintenance, low-cost, reliable and accurate battery monitoring system for unmanned, remote monitoring of battery plants for prediction of battery health, i.e. to predict whether or not the battery strings are capable or incapable of providing uninterrupted service for a predetermined period of time if the main AC power source fails. An alarm message can then be transmitted to the CO to allow the problem to be addressed, or other action, such as automatic disconnect, may be taken.

SUMMARY

A system for monitoring performance of one or more batteries in a battery plant facility. A set of sensors for each battery are used to measure a plurality of battery operation parameters comprising the battery current, battery voltage, and internal battery temperature of each said battery. A processor generates, for each battery, a plurality of battery status parameters comprising a true age parameter and a float capacity parameter. During a float period, the true age parameter is updated based on elapsed time corrected for battery temperature history and the float capacity is updated based on the most recent true age parameter. During a discharge period, the float capacity parameter is updated based on the evolution of plant voltage during the discharge. After the discharge period, at the beginning of a subsequent float period, the true age parameter is updated based on the float capacity parameter determined during the immediately previous discharge period.

BRIEF DESCRIPTION OF THE DRAWINGS

These and other features, aspects, and advantages of the present invention will become more fully apparent from the following description, appended claims, and accompanying drawings in which:

FIG. 8 is an exemplary computer display screen showing a temperature difference panel used with the battery monitoring system of FIG. 1;

FIG. 11 is an exemplary computer display screen showing a plant status panel used with the battery monitoring system of FIG. 1;

FIG. 12 is an exemplary computer display screen showing an alarm configuration panel used with the battery monitoring system of FIG. 1;

FIG. 13 is an exemplary computer display screen showing a latest alarms panel used with the battery monitoring system of FIG. 1;

DESCRIPTION OF THE PREFERRED EMBODIMENT

Figure 1:
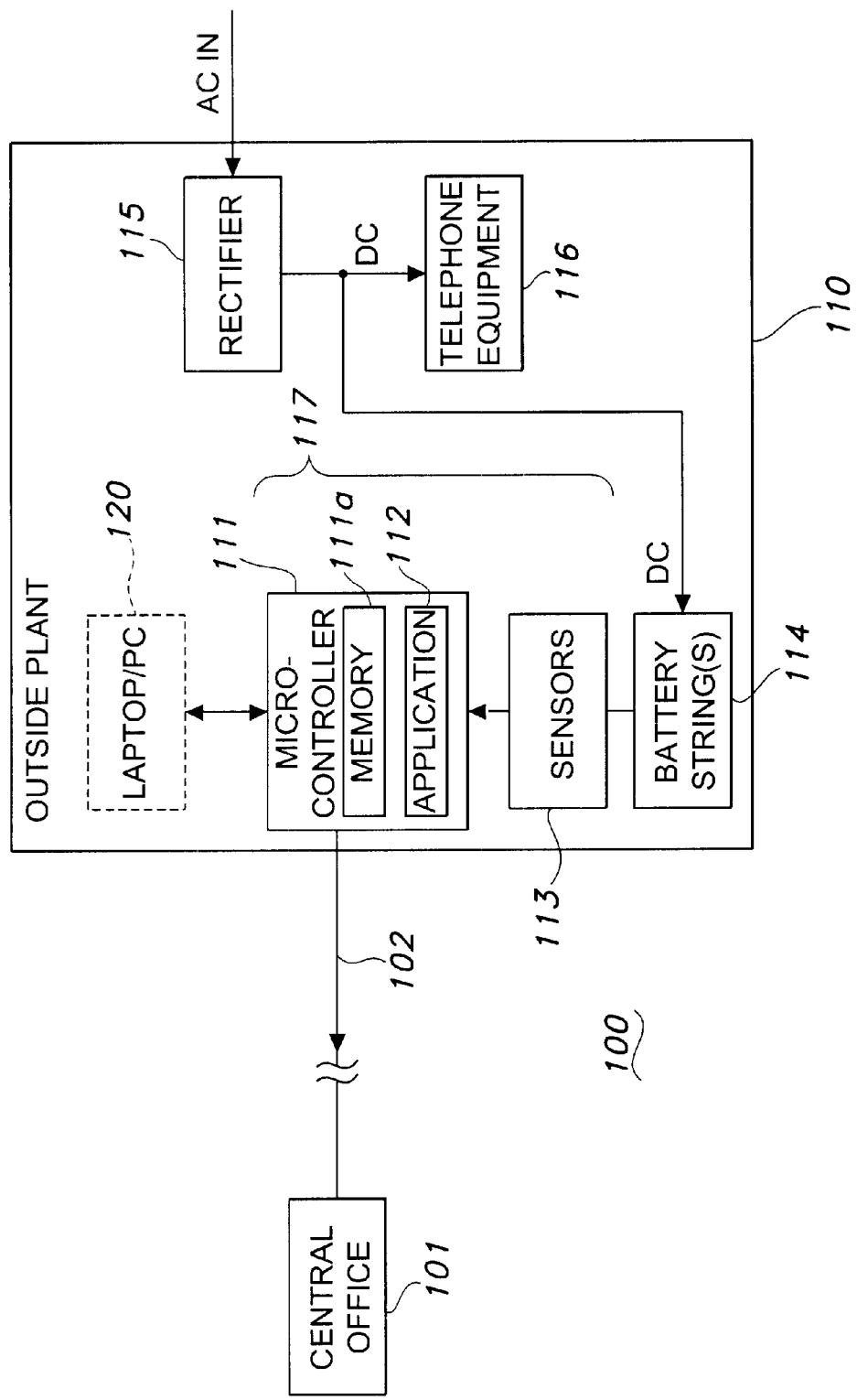
FIG. 1 is a block diagram of a battery-based power plant system having a battery monitoring system, in accordance with an embodiment of the present invention.

Referring now to FIG. 1, there is shown a block diagram of a battery-based power plant system 100 having a battery monitoring system or subsystem 117 in accordance with an embodiment of the present invention. System 100 comprises central office (CO) 101, outside plant (OP) 110, and a communications medium or means such as telephone line 102, which provides communications between the CO and OP (e.g., alarm messages sent from the OP to the CO). CO 101 may be a central office of a telephone system, and OP may contain various telephone equipment 116. This equipment is normally powered by the DC power derived by one or more rectifier(s) 115 from AC power received from an external AC commercial power grid.

OP 110 comprises at least one backup battery string 114 whose function is to provide emergency backup DC power to telephone equipment 116 in the event of loss of AC power. In one embodiment, there are four battery strings in parallel. Each string contains a number of series-connected cells, e.g. 12 or 24 2-V cells so that each battery string nominally provides 24 or 48V of DC power. Battery strings 114 are continually charged by rectifier 115 in float mode (in which case the string current for a given string is a float or trickle-charge current). If AC power is lost, rectifier 115 stops providing a DC output and battery strings 114 immediately begin providing power to telephone equipment 116. This phase may be referred to as a discharge phase or operation. In this phase, the string current is referred to as the discharge current. After AC power is restored, the battery strings 114 are recharged by the DC power from rectifiers 115 until float is achieved once more. During this recharge mode or phase, the string current for each string is referred to as the recharge current.

A set of sensors 113 are coupled to the battery strings to provide various operational parametric readings to controller or microcontroller 111. In one embodiment, there is a string current sensor, a battery string voltage sensor, a battery string midpoint voltage sensor, and a temperature sensor, for each battery string. The temperature sensor for a given string consists, in one embodiment, of two cell temperatures sensors. In an alternative embodiment, the ambient temperature is also measured.

Microcontroller 111 runs a monitoring application program 112 and has memory 111a. In alternative embodiments microcontroller 111 may be any processor such as a CPU of a PC. A laptop 120 or other computer may be plugged into microcontroller 111 when a site visit to the OP is made, to view logs or configure application 112.

As described in further detail below, application 112 continually monitors the status of battery strings 114 by analyzing the parameters provided by sensors 113. Various battery conditions may be detected, which are used by application 112 to generate one or more alarm signals (such as a major alarm and minor alarm) and to transmit these via telephone line 102 (and a modem, for example) to CO 101, and also to generate one or more disconnect signals which may be used to disconnect equipment upon certain conditions to prevent damage thereto.

The alarm may be detected at the CO and may be responded to as appropriate, by sending personnel to the OP for a site visit if necessary, to determine the exact nature of the failure or problem in greater detail and/or to repair the problem or replace or repair the defective equipment or battery strings. Thus, the battery monitoring subsystem 117 of system 100 comprises microcontroller 111, sensors 113, and also phone line 102. The disconnect signals may be considered another type of alarm signal, since both alarm signals and disconnect signals are generated based on the detection of certain conditions, and may be acted on in various ways by external entities such as personnel or disconnection equipment.

Battery monitoring subsystem 117 may also be referred to as a "battery node". Other components of OP 110, such as rectifier 115, equipment 116, and a plant controller and distribution panel (not shown) may each have their own respective nodes which monitor the operation of these respective items. All the nodes of OP 110 may be coupled to a master node (not shown) for sending alarm or other messages via phone line 102 or other communications means to other facilities such as CO 101. The present invention concerns the operation of the battery node or battery monitoring subsystem 117.

An object of the present invention is to provide a low-cost, automated battery plant monitoring system which is nevertheless reliable and accurate. To maintain low cost, expensive and intrusive techniques such as impedance measuring are avoided. In one embodiment, the present invention provides an alarm that notifies a user (e.g. personnel at the CO) of an impending problem or condition of battery string(s) 114. The system also collects data which can be inspected by personnel making a site visit to help identify the most likely cause of the problem. The data collected is also used in calculating various battery performance parameters which are in turn used in determining when and whether to issue an alarm, and what type (e.g. minor or major) of alarm to issue.

In an embodiment of the present invention, certain key parameters are monitored which allow the majority of charging problems to be predicted in time, without necessarily identifying the precise cause or location of the problem. These parameters may be referred to as battery operation parameters, such as string voltage (as well as midpoint voltage), string current, and post or pilot cell temperature (the internal temperature of the battery string). Parameters with lower features to cost ratios are avoided. Thus, tremendous amounts of data which must be searched through for the desired information are avoided. In an embodiment, as noted above, sensors 113 contain only passive sensors which measure voltage, current, and temperature parameters related to each battery string 114.

The user of a remote site receives only an alarm (which may be major or minor), but which does not identify the exact cell which may be failing or exact cause of the battery's problem. However, there is relatively little value in the remote operator knowing the exact cause or location of the problem, because in any event a site visit needs to be made to address the problem. Once the technician arrives at the site, the bad cell(s) or other problem can usually be done on-site with minimal human investigation utilizing other readily available equipment. Thus, the present invention allows the number of sense points to be limited to a small number necessary to generate an accurate alarm. This helps to keep product and installation costs low, and also decreases the amount of data to be polled, processed and stored by the system. As described in further detail below, the present invention uses a processor to generate, for each battery, a plurality of battery status parameters comprising a true age parameter, a float capacity parameter, and a remaining discharge time parameter based on the battery temperature history for the battery and based the real-time evolution of battery current, battery voltage, and battery temperature during a battery discharge of the battery.

Thus, the battery monitoring system of the present invention effectively combines low-cost, automated testing procedures as preventative maintenance, and relies on manual testing processes for contingency information. The battery monitoring system allows reliable, accurate predictions of potential failure or other problems, which allows the user to visit the site under minor or major alarm conditions in due time with highly advanced equipment to isolate the cell(s).

As described in further detail below, these battery operation parameters are used to generate one or more battery string status parameters, including, in one embodiment, actual battery capacity (at float), remaining discharge time (i.e., reserve time, during discharge), and effective (or "true") battery age. These battery status parameters, which relate to battery health, may be compared to predetermined minor and major thresholds to determine whether to generate a minor or major alarm. An alarm condition may also be detected based on other calculations performed on the battery operation parameters, e.g. based on changes in float current.

The present battery monitoring system and method recognizes that battery failure/wear is usually a consequence of the following: overcharge, leading to gassing and loss of capacity; undercharge, also leading to loss of capacity; aging, due to accumulated number and depth of discharges; temperature, decreasing the effective life of the battery; and sudden failures.

Two battery status parameters are of prime importance for the user: actual battery capacity (after a recharge cycle, i.e. at float), and remaining discharge time (during discharge). In practice, both are linked and the capacity at a given point represents a unique parameter. If either parameter falls too low, this indicates a problem which should generate an alarm. For example, if the battery capacity drops from the nominal 8 hours to 1 hour, an alarm should be generated so that a site visit can be made to address this situation. Or, if, during a discharge situation, the expected reserve (remaining discharge) time falls below a threshold, an alarm should be generated. Thus, battery monitoring system 117 continually monitors the sensed voltage, string current, and temperature data and predicts battery capacity (during float) and reserve time (during discharge). These computed values are compared to predetermined threshold values, to generate the appropriate alarm if the threshold is exceeded. As described below, the true battery age is also computed because it is used as a baseline to calculate the float capacity and remaining discharge time parameters. The true battery age may itself also be compared to a threshold to generate an alarm.

In one embodiment, battery monitoring system 117 predicts battery capacity based on past history in combination with instantaneous data compiled in real time. Thus, key battery data must be recorded.

One of the best indicators of battery health is the actual behavior of the battery during a discharge. Despite the fact that detecting a problem at this point is late, it is quite likely that there will be little change between two consecutive discharges, unless a sudden failure has occurred. Therefore, a discharge (even as little as minutes) provides precious data about what the next discharge will be, if pertinent data was recorded in the processed battery history. Discharges can be natural (i.e. during an AC outage) or forced.

Another key indicator of battery health is float current. Batteries used in telecommunications applications are under float conditions most of the time, so that it is usually convenient to monitor the float current. In fact, the actual value of the float current is less significant than its evolution with time. Thus, the present invention records float current data so that historical trends can be discerned and analyzed.

These sensed parameters are used to make various predictions. One prediction is the true age of battery. E.g. a battery may be designed for 20 years at a temperature of 25° C. If it is run continually at a higher temperature, it will age more quickly. Thus, by monitoring only current, voltage, and temperature (battery operation parameters) and by recording and keeping a log of the relevant data for the relevant past time periods, the present invention is able to accurately predict battery performance by determining various key battery string status parameters, such as battery capacity, remaining discharge time, and true age.

An alarm may be generated and transmitted to CO 101 when any of these status parameters (or other calculated parameters based on the battery operation parameters) exceeds a threshold. Service personnel may then be dispatched to make a site visit to determine which cell has the problem and what is the cause. A PC or laptop may be plugged into a port in microcontroller 111 to allow access to historical log data and other data to help the technician more precisely identify the cause of the problem which tripped the alarm.

True Age

During float conditions, the true age of the battery is tracked by application 112 by increasing the true age in accordance with the passage of real time. For example, a battery with a true age of 12 years would normally be considered to be 13 years old one year later. However, in the present invention, the passage of time is modified after compensating for temperature deviations from ideal. For each unit of time (e.g., an hour) the battery spends at temperatures higher than nominal (e.g., 25° C.), more time is added than actually passes. This is described in further detail below with respect to Arrhenius' law for chemical processes and Eqs. 2, 15. During float, the battery capacity is updated based on the true age every time the true age is adjusted.

Moreover, every time there is a discharge, the battery capacity is recalculated, as discussed below. Whenever this happens, the true age of the battery is adjusted in accordance with this new battery capacity calculation. This adjustment to the true age is based on the assumption that the battery capacity is expected to decline in a certain manner over the life of the battery. For example, it may be assumed that battery capacity decays nearly linearly with time, reaching 80% nominal capacity when the expected life has been reached. This is described in further detail below with respect to Eq. 1 et seq.

In addition, the true age adjustment after a discharge takes into account the depth of the discharge and the total number of discharges, since these factors can also affect the battery age. This is described in further detail below with respect to Eqs. 5, 6.

Battery Capacity

During a float period, the battery float capacity is updated each time the true age is updated. During a discharge, the battery capacity is re-calculated by using the last battery capacity from the previous float period and by taking into account the behavior of the battery during the discharge period.

During a discharge period, the battery capacity is continually re-calculated during the discharge for use in the remaining discharge time computation (discussed below). This draws on the fact that the actual behavior of the battery during a discharge is an indicator of battery health. As described in further detail with reference to FIGS. 3–4 and Eqs. 12–14, battery capacity is calculated based on the expected discharge curves for the battery, which is corrected with temperature and rate of discharge. In particular, the evolution of the plant voltage versus cumulated Ah, in comparison to an ideal (and corrected for temperature and discharge rate) is used to calculate the overall plant float capacity, using the most recent float capacity information generated during the last float period as a starting point. Then, based on the relative value of the string currents delivered by each battery string during the first 5% of the discharge, the battery capacity for each battery is extrapolated based on the plant float capacity just calculated.

Remaining Discharge Time

During discharge, the remaining discharge time is continually computed, as described in further detail below with reference to Eq. 11. This status parameter is calculated as a function of the most recent battery float capacity computation (which is preferably generated repeatedly during a discharge period), as well as the present discharge string current, and the number of Ampere-hours (Ah) removed to that point from the battery since the beginning of discharge. The remaining discharge time calculation is preferably corrected by two correction factors, $k_T$ and $k_I$. The $k_T$ correction factor is a capacity correction factor which takes temperature into account, as described in further detail below with reference to Eq. 7. The $k_I$ correction factor is provided from a table supplied by the battery manufacturer, which contains data on the battery capacity versus discharge rate (e.g., the expected discharge curves for the battery). Thus, the remaining discharge time may also be said to be based on the expected discharge curves, corrected for temperature and rate of discharge.

Float Current Changes and Probability of Failure

Battery monitoring application 112 also records float current data over significant periods of time. If the average float current magnitude (or, alternatively, instantaneous float current) changes by more than a specified percentage or amount from one time period to another, this may be indicative of a problem developing in the battery. A probability of failure parameter may thus be generated based on the evolution of the float current with time. For example, the average float current for the last hour may be compared to the average float current for a previous hour some time in the past.

In an embodiment, the probability of failure parameter is the same as or based on the percentage change of the float current magnitude at the current time relative to the float current magnitude at a previous time period (an initial float current value). For example, as described below with reference to FIG. 5, it may be considered that the probability of failure is zero when the present float current is 200% of its initial value, and 100% when the present float current is 400% of its initial value. This parameter may then be compared to a threshold.

The probability of failure parameter may also be corrected by taking into account the effect of true battery age and temperature on the float current. For example, a battery may have a 100 mA float current at a true age of 5 years, at 25° C. It may be expected that the float current will change with temperature. Thus, so that apples may be compared with apples, the float currents measured and recorded at two different times must be corrected for temperature to produce normalized float current values. These may then be compared to each other to determine whether the difference is enough to warrant a minor or major alarm. The present invention, therefore, evaluates the state of battery string health by monitoring the evolution of the recharge current during float.

Figure 4:
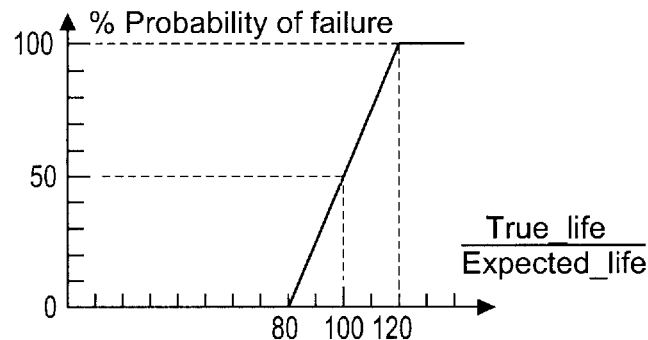
FIG. 4 is a graph showing probability of failure versus true battery age.
Figure 5:
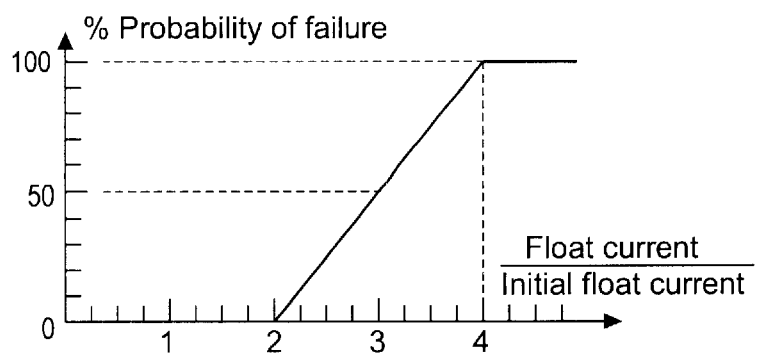
FIG. 5 is a graph showing probability of failure versus float current.

As described below with reference to FIGS. 3–5, other probability of failure parameters may be generated based on the true age and initial discharge current rate. The highest of these three parameters may be used as a single or overall probability of failure parameter and compared to a respective threshold or thresholds.

Midpoint Voltage

In an embodiment, the midpoint voltage as well as string voltage are monitored by application 112. The ratio of midpoint to string voltage is ideally 1/2 (0.5). This ratio can be computed and compared to a threshold to determine whether there is a shorted cell. This is because a shorted cell is always on one side of the midpoint, and thus causes the ratio between the midpoint voltage and the string voltage to change to some determinable amount higher or lower than 0.5. For example, in a 24-cell battery having 2V cells, the midpoint voltage (ideally 24V) is expected to be half that of the string voltage (ideally 48V). If a cell included in the midpoint voltage measure shorts out, the ratio will be (24-2)/(48-2)=22/46=0.48, which is less than 0.5 If a cell not included in the midpoint voltage shorts out, the ratio will be 24/(48-2)=24/46=0.52. Thus, in this example, a ratio that deviates from 0.5 by approximately 2/100 or greater can indicate a shorted cell.

If a cell (or like number of cells) shorts out on each side of the battery, the voltage ratio would still be 0.5 and could not indicate the shorted cell. However, in this case there would be a higher float current. Thus, the such a cell short condition would be detected by the float current change aspect of the monitoring of system 117, described above.

Major and Minor Alarms

In an embodiment, different thresholds may be set for some or all of the generated status parameters for use in triggering minor and major alarms. A major alarm is used in case of an actual or impending service-affecting failure. For example, if remaining discharge time drops too low, this can trigger a major alarm so that service personnel are dispatched immediately to determine and address the exact problem. A minor alarm is used for non-service affecting failure. For example, a minor alarm may be issued when a 20-year battery reaches a true age of 18 years, so that it can be replaced.

In an embodiment, a string disconnect mechanism (e.g. relay) may be included in battery monitoring system 117, under the control of microcontroller 117, to disconnect a given battery string to protect the string from potential damage, upon the detection of a given condition, such as a major alarm condition.

In alternative embodiments, various types of alarms may be provided based on various thresholds or conditions. E.g., four form-C alarm relays may be provided: major, minor, auxiliary, and system failure. A plant disconnect relay may also be provided, which is triggered on the detection of certain conditions, such as ambient temperature and/or plant voltage exceeding a threshold.

Data Logging, Graphic Interface, and System Software

The present invention provides for simultaneous recording (data logging) of various parameters and events, such as alarms, plant history and evolution of parameters during discharge, in independent memory storage areas of memory 111a. A computer 120 may be plugged into microcontroller to obtain a graphical representation of downloaded data. A CGI (computer graphic interface) may also be provided to a user to allow various application settings or parameters (such as the various thresholds) to be set or changed. This allows minor and major alarms to be generated to a plant manager (e.g., CO 101) upon conditions predefined by the user. Thus, system 117 is a programmable, multi-purpose alarm system.

As explained previously, the battery monitoring system 117 of the present invention strategically monitors and controls, in one embodiment, up to four strings of batteries 114. In an embodiment, battery monitoring system 117 is designed to be on line with full-time data acquisition, status calculations (including reserve time, battery capacity, and true age predictions), at a minimal cost. System 117 provides the user with customized data logging, and is fully configurable for different string voltages (e.g., 24/48V), plant capacity, alarm thresholds and patterns, number of strings, and the like. In an embodiment, system 117 may be used to monitor up to four battery strings in parallel.

In an embodiment, system 117 allows for expansion up to 512 Kbytes of battery backed-up storage memory, clock, network capability, and a RS232 link to a PC 120. A windows-type Graphical User Interface (GUI) is used to provide intuitive usage via PC 120 of system 117 via the RS232 serial connection. In an embodiment, the microcontroller 111 uses a Neuron 8-bit processor which also supports LonWorks® networking. The monitoring application 112 program is written in the C language and is executed once every 250 msec. The time base is provided by an internal clock circuit. The hardware uses standard components such as microprocessor peripherals, latches, Flash program memory, RAM data memory and backed-up logging memory.

Application 112 is based on configuration tables associated with each function. These tables may contain analog thresholds for voltage, current, or temperatures; initialization values (number of strings, scales, dates of installation, etc.) or a binary description of each equation governing the string disconnect or alarms. Application 112 is divided in several modules, such as the time module and others, each of which is described below.

Time Module

The time module processes the time base and software time delays. Its duties are to update the 20 software time delays of application 112 every ¼ sec, synchronize the system with its real time clock, and generate LED flashing codes.

Data Acquisition Module

The role of the data acquisition module (201 of FIG. 2A) is to acquire, scale, and digitally filter the 20 analog channels (voltage, current, temperature) and five digital inputs (feedback from disconnect and LVD contactors). The channels corresponding to uninstalled strings are ignored. This module also debounces the five digital feedback inputs.

Serial Link Module

The serial link module (202 of FIG. 2A) controls the exchange of data between microcontroller 111 and PC or laptop computer 120. In an embodiment, the protocol is "panel" rather than "single variable" oriented. The PC software (described in the Status Panel/Menus section below, with reference to FIGS. 9–15) is designed to provide a GUI based on panels, each of which regroups several variables together. All these variables are transmitted at once, through a packet of data containing from 10 to 50 bytes, depending on the panel.

Some panels are "status-only" and merely send the updated variables upon request from the PC, while some others are "configuration" and may be sent in both directions, for upload or download. There are five status panels and thirteen configuration panels. The monitoring system obeys requests or commands from the PC. The only exception to this rule is alarm occurrence, where system 117 sends the alarm message on its own. Every data packet contains destination and origin addresses and, a function code, as well as the data itself. It is verified by a check-sum prior to being processed. An acknowledge/resend mechanism is included in the protocol.

Status Equations Module

All voltage, current and temperature thresholds are stored in three panels transmitted by PC 120 during the configuration process. Each panel handles all strings, which may have completely independent thresholds. The values are ignored if a string is not installed. The role of the status equations module is to compare all analog variables (directly measured or calculated) against the predefined thresholds and build a dynamic system status table which will be used by the subsequent parts of the program. This table contains the binary result of a total of 40 comparisons, called "members". Twenty-eight members are string-related (7×4) and 12 are plant-related. In this manner, there is a permanently updated system status map available in system 117, which may be retrieved via the GUI.

Disconnect Equations Module

Figure 2A:
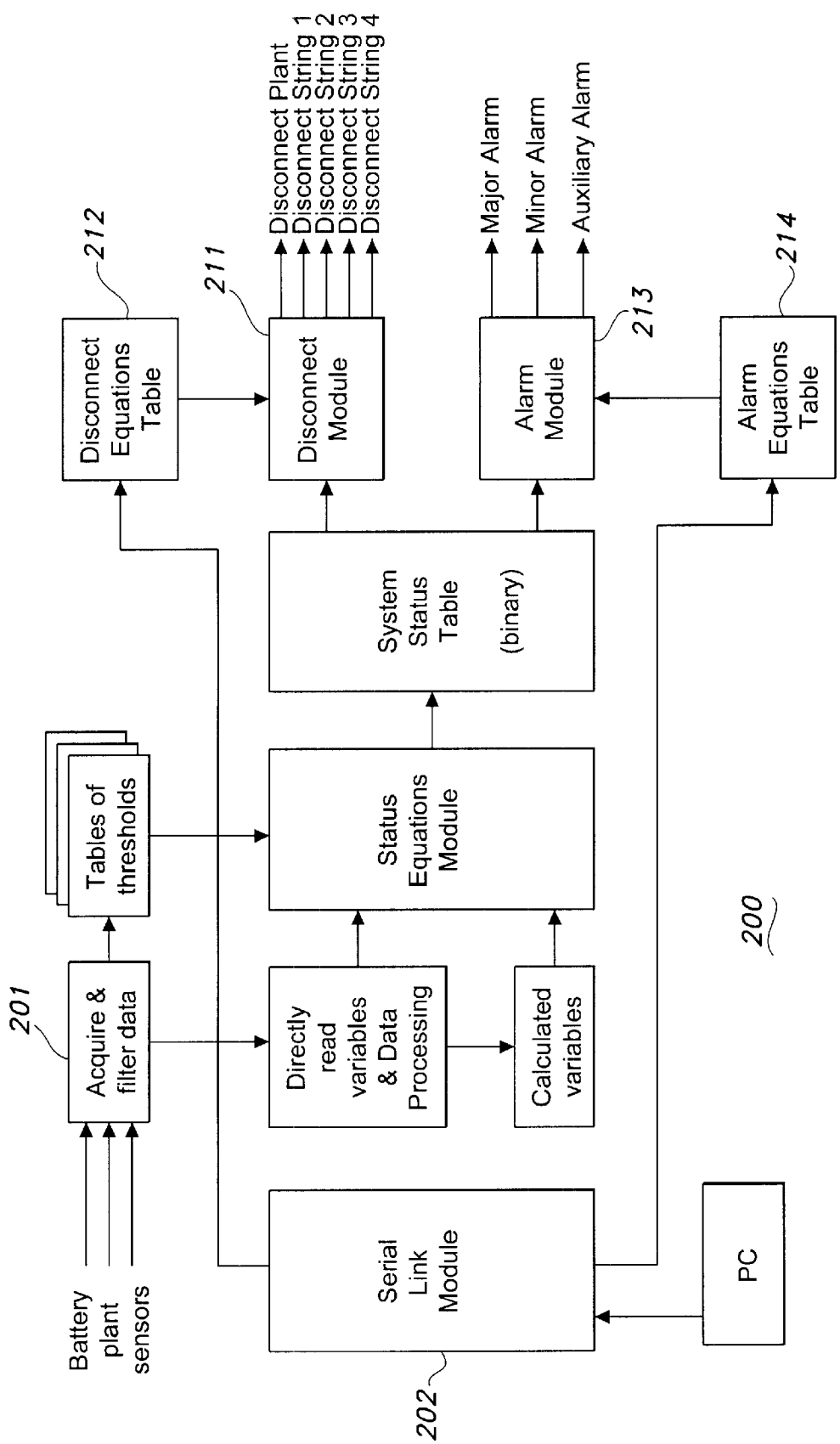
FIG. 2A is a block diagram illustrating the data flow for the disconnect and alarm processing of the battery monitoring system of FIG. 1.

Referring now to FIG. 2A, there is shown a block diagram 200 illustrating the data flow for the disconnect and alarm processing of battery monitoring system 117. With respect to disconnect processing by the disconnect module 211, for each string, seven members related to the string itself can lead to a string disconnect: temperatures (two absolute and two differential), current (charge or float), or midpoint voltage. Another set of members related to the plant also lead to a disconnect, but are common to all strings: maximum plant voltage or current, maximum or minimum ambient temperature.

Monitoring application 112 uses a "disconnect equations" panel or table 212 which holds the list of which members are selected by the user to allow a disconnect for a particular battery string. Each threshold comparison result held in the system status table is "masked" with its corresponding binary member in the "disconnect" table. Finally, all results are OR'd, providing a final decision to disconnect or reconnect the string. A user-programmable time delay (1 to 60 minutes) is provided to delay the disconnect action. The string will be immediately reconnected when all disconnect conditions have disappeared. The disconnect operation may be latched, permanently enabled or disabled, or automatic.

Alarm Equations Module

A similar principle as used for the disconnect equations module is used by the alarm equations module 213 of FIG. 2A to process alarms: a user-defined "alarm table" panel or table 214 contains the list of members which are allowed to generate an alarm (described in further detail below with reference to FIG. 12). Each alarm (Major, minor, auxiliary) has its own table, divided into four columns. The first column is an OR combination, i.e any validated alarm condition will trigger the corresponding alarm. The three other columns are AND combinations, i.e all validated alarm conditions in this column must be present to trigger the alarm.

Finally, the binary results of the four columns are OR'd to produce the actual alarm status. As in the disconnect module, user-programmable time delays (1 to 60 minutes) are provided to delay the alarms. Any alarm will be immediately reset when all alarm conditions have disappeared.

Battery Module

The battery module is the largest code section in the monitoring system 117 and monitoring application 112, and it contains all the algorithms used to predict the battery capacity and generate eventual alarms.

As noted previously, these algorithms are based on the assumption that the battery capacity decays almost linearly with age, reaching 80% when the expected life has been reached. Thus, the battery age may be used as a baseline for all predictions. The relation between age and capacity at float may be expressed as follows:

$$\text{Current\_capacity} := \text{Initial\_capacity} \cdot \left(1 - \frac{0.2 \cdot \text{True\_age}}{\text{Expected\_life}}\right), \quad (1)$$

where Initial Capacity is the previous capacity prediction from the last iteration, Expected life is the life specified by the manufacturer at 25° C. operating temperature, and True age is the true or effective calculated battery age. The true battery age is not only calculated from time, but also from temperature, number and depth of discharges.

The Battery Aging Process

As explained previously, the present invention calculates battery capacity on float, true battery age, and reserve time during discharge. To calculate the true battery age, Arrhenius's law is employed. Being a chemical element, a battery follows Arrhenius's law, which estimates that the given life at a particular temperature decreases by two for every 10° C. increase. For a battery, the typical given life is at 25° C. This corresponds to a exponential-type expression:

$$\text{Expected\_life}_T = \text{Expected\_life}_{25} \cdot 2^{\frac{25-T}{10}}, \quad (2)$$

where T=temperature in ° C. This can be expressed verbally by saying that every hour spent at a temperature different from 25° C. is equivalent to x hours spent at 25° C., the "x" being the Arrhenius factor, and T the temperature in ° C.:

$$x := 2^{\frac{25-T}{10}} \quad (3)$$

The true life can therefore be calculated by calculating the average temperature for an hour, then adding the equivalent Arrhenius hours to the current total of hours:

$$\text{True age}(t+1 \text{ hour}) = \text{True age}(t) + x \quad (4)$$

The number and depth of discharges also impact the battery life. A battery is usually characterized by N discharges @ n % depth before capacity reaches 80%. This corresponds to the definition of the expected life (described above with reference to Eq. 1). Thus, a single discharge @ d% depth may be said to be equivalent to aging the battery by:

$$\text{Discharge\_effect} := \frac{\text{Expected\_life}_{25} \cdot d}{N \cdot n} \quad (5)$$

Thus, at the end of every discharge, the discharge effect is added to the true battery age, as follows:

$$\text{True age}(t) = \text{True age}(t) + \text{Discharge effect} \quad (6)$$

Obtaining the Current capacity at float is a matter of calculating Eq. 1. However, this capacity expression is affected by instantaneous temperature and by the discharge current level and must be corrected to calculate the reserve time during an actual discharge.

Correction of Capacity Expression

Empirical testing by the inventors has shown that the current capacity during a discharge is linearly affected by temperature at a rate of 0.5% per ° C. However, this effect is canceled at high temperature by other factors, such as increased float current. Thus, this effect is limited, in an embodiment, to +10% to obtain a reasonable image. The capacity correction factor $k_t$ is thus calculated by:

$$k_T := 1 + 0.005(T - 25) \quad (7),$$

with $k_T \leq 1.10$.

Battery capacity is also affected by the discharge current level in a complex fashion, which introduces a correction factor $k_i$. To normalize this parameter, it is more convenient to express it as a function of the ratio Capacity/discharge time, which is a standard factor (C/n) in the battery industry. Because of complex expression requirements, it is preferable to obtain $k_i$ from a table. The index of the table ranges from 0 at C/20 to 32 at C/2, which covers most of the telecom normal application area. The average discharge current is first calculated:

$$\text{Discharge\_current} := \frac{\text{Ah\_removed}}{\text{Discharge\_time}}, \quad (8)$$

where Ah removed is a cumulation of the energy taken from the battery since the beginning of the current discharge:

$$\text{Ah removed}(t) = \text{Ah removed}(t - \Delta t) + \text{String current} \cdot \Delta t / 3600 \quad (9)$$

The table index is obtained by calculating the ratio between the discharge current and the current required to discharge the battery in 20 hours and scaling to obtain an index of 32 at C/2:

$$\text{Index} := \frac{\text{Discharge\_current}}{\frac{\text{Initial\_capacity}}{20}} \cdot 3.2 \quad (10)$$

Finally, the reserve time during discharge Trd can be calculated by:

$$\text{Trd} := \frac{(\text{Current\_capacity} - \text{Ah\_removed}) \cdot k_T \cdot k_I}{\text{String\_current}}, \quad (11)$$

where String current is the present string current.

Realignment of Capacity after a Discharge

At the end of a significant discharge, the true age of the battery is re-evaluated to realign the calculated parameters with the actual battery condition. This provides more accurate starting conditions for the next discharge. The realignment of the capacity is based on a simplified equivalent schematic of a battery, which is a pre-charged capacitor in series with its internal impedance. A mathematical model for a battery is described in C. M. Shepherd, "Design of Primary and Secondary Cells," *Journal of Electrochemical Society*, July 1965, vol. 112, pp. 657–664, which contains related equations referred to as Shepherd's equations.

To eliminate the non-linearity of the curve Vplant=f(time) due to differences between constant current load and constant power load, we have selected to use the curve Vplant= f(Ah removed), which would be purely linear if the battery was really a capacitor and the load was constant current.

To normalize the calculation, the Ampere-hours removed from the battery are corrected to obtain what they would be at C/20 discharge and 25° C. temperature. This can be done using the previously calculated parameters $k_i$ and $k_t$ and calculating the following equation:

$$\text{Ah\_removed\_at\_C20} := \frac{\text{Ah\_removed}}{k_I \cdot k_T} \quad (12)$$

This value and the current plant voltage may then be used to recalculate a new capacity based on the voltage drop. The initial voltage is calculated using an algorithm which compensates for an eventual "coup de fouet" phenomena and provides an accurate plant open voltage $V_o$. The voltage drop at any time is therefore:

$$\text{Voltage drop} = V_o - \text{Plant voltage}$$

Shepherd's equations show that the decay of the battery voltage during a discharge can be approximated by the addition of two curves: a linear decay, which represents the normal loss of voltage of a (large) capacitor discharged with a constant current; and a hyperbolic decay, which represents the chemical reactions inside the battery and make the voltage drop very sharply when the battery is exhausted.

The first curve can be precisely calculated because we know the nominal capacity and the current; it is therefore a simple integration of the current: linear voltage drop=initial voltage-k·(Integral of (Current·dt)/Nominal Capacity), where k is a scaling factor representing the rate of decay of a new battery, constant for any type of battery.

This linear voltage drop is calculated and subtracted from the actual measured voltage drop since the beginning of the discharge. The result is thus the hyperbolic term.

$$\text{Hyperbolic drop} = \frac{k \cdot \text{Ah discharged}}{\text{Actual capacity} - \text{Ah discharged}}, \quad (13)$$

Actual capacity being what we want to know. This formula is based on two factors: the asymptote of the hyperbola is when Ah discharged=Actual capacity; and the voltage drop is also proportional to a factor k which is unknown but reflects the wear-out of the battery (the greater k=wear-out factor, the greater the voltage drop).

This leaves two unknowns (k and Actual capacity) in a single equation. However, k and Actual capacity are linked because they ultimately represent the capacity of the battery. After empirical testing and mathematical modeling, the inventors have found that actual capacity (Actual capacity) may be approximated as follows:

$$\text{Actual capacity} = \text{A certain capacity} \cdot (1-k) \quad (14)$$

were the "A certain capacity" term is a constant equal to the nominal capacity+11%.

Thus there is at this point a single unknown k in equation 13, which can be calculated because the drop is known (measured), the nominal capacity is known, and the Ah discharged is known (by integration of the discharge current). Once k is calculated, the Actual capacity is calculated from Eq. 14 above. Thus, the curves utilized depend solely on the actual capacity of a battery.

These calculations give the capacity of the plant (considered as a single string), but not the capacity of each battery string. Since the strings interfere with each other, it is virtually impossible to evaluate the capacity of each string in an accurate manner. However, extensive testing has shown that the string current during the first instants (initial portion) of a discharge closely reflects the battery internal impedance, which in turn is considered to be an image of the battery state of health. The present invention uses this property to derive the capacity of each string from the relative value of the current delivered by each one during the first 5% of a discharge. Thus, in one embodiment the initial portion of the discharge is the first 5% of the discharge, measured by current discharged.

An algorithm looks for the string supplying the highest current rate (Current/Capacity) and calculates the ratio of current rate delivered by the other strings at the same moment. The string delivering the highest current rate is given a ratio of 1.0, and the other strings are attributed a lower value corresponding to the current delivered.

The capacity of each string is then multiplied by this ratio, after which all values are normalized so that their sum is equal to the calculated capacity of the plant, from equation (14).

Finally, the updated True age for each string is obtained from Eq. 1 by:

$$\text{True\_age} := 5 \cdot \left(1 - \frac{\text{Actual\_capacity}}{\text{Capacity\_new}}\right), \quad (15)$$

and updated for the next discharge.

Data Flow

Figure 2B:
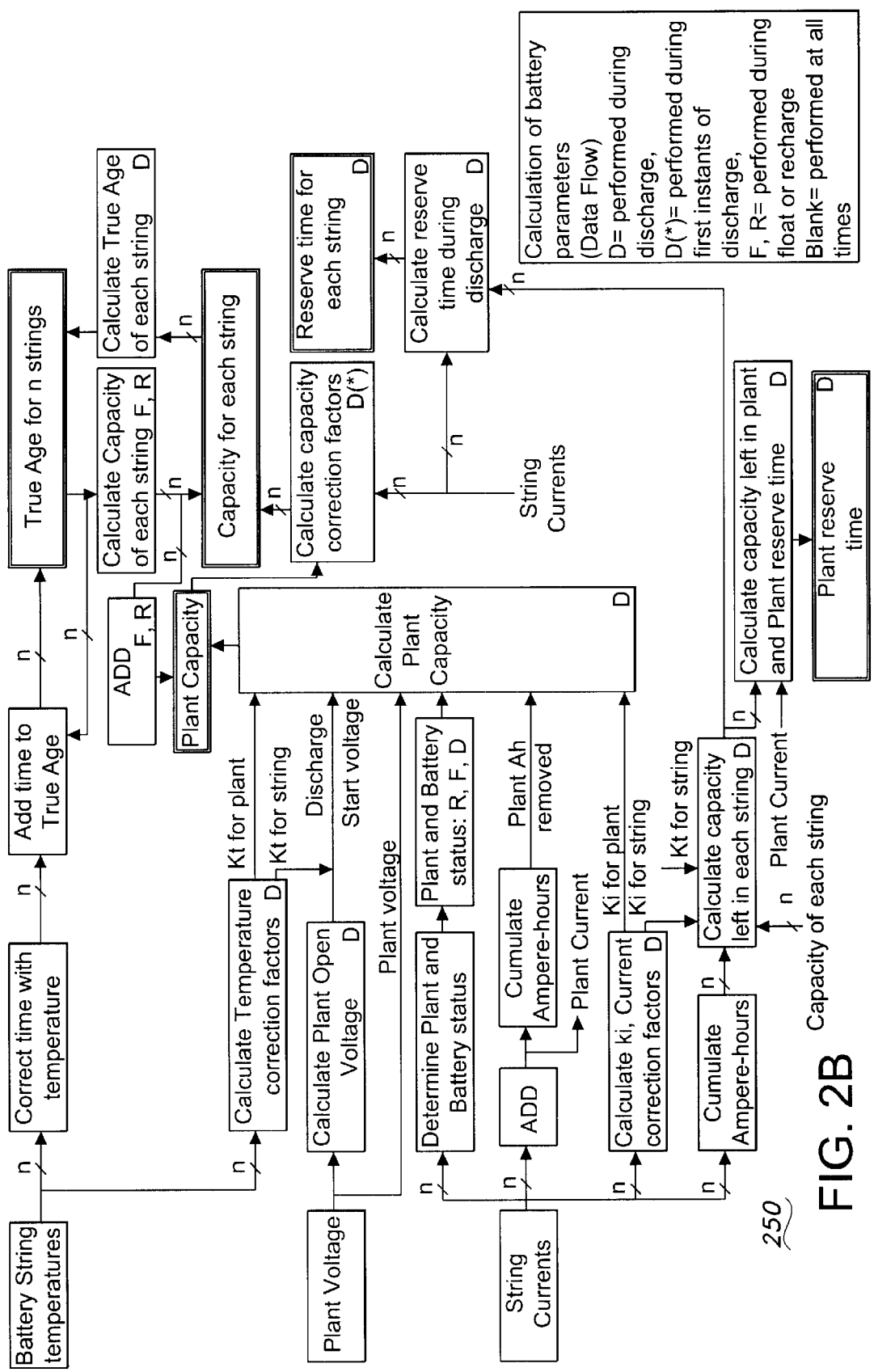
FIG. 2B is a block diagram illustrating the data flow of the calculation of a plurality of key battery status parameters of the battery monitoring system of FIG. 1.

Referring now to FIG. 2B, there is shown a block diagram illustrating the data flow 250 of the calculation of a plurality of key battery status parameters of battery monitoring system 100. Data flow 250 illustrates in diagrammatic form the use the battery operation parameters (battery current, battery voltage, and internal battery temperature) to repeatedly re-generate, for each battery, the plurality of battery status parameters for that battery (true age, float capacity, and remaining discharge time, as well as more global estimates based on these, such as plant capacity and plant reserve time).

Thus, in the present invention, key battery status or performance parameters are calculated solely based on the passive measurements of current, voltage, and temperature and by relevant logs of same. During float, true age is repeatedly recalculated, e.g. once per hour, by adding the elapsed time but corrected for temperature. Each time the true age is recalculated in this manner, the battery float capacity is updated based on the true age. During a discharge, the evolution of the plant voltage versus cumulated Ah, in comparison to an ideal (and corrected for temperature and discharge rate) is used to calculate the overall plant float capacity, using the most recent float capacity information generated during the last float period as a starting point. Then, based on the relative value of the string currents delivered by each battery string during the first 5% of the discharge, the battery capacity for each battery is extrapolated based on the plant float capacity just calculated.

Also during the discharge, the reserve time may be derived from the battery float capacity and cumulated Ah, and is preferably corrected for temperature and based on the expected discharge curves for the battery.

After the discharge period is over and the next float period begins, the true age is recalculated based on the float capacity determined during the discharge period. In addition, the true age adjustment after a discharge takes into account the depth of the discharge and the total number of discharges, since these factors can also affect the battery age.

Subsequently, in the next float period, the true age is repeatedly updated using elapsed time corrected for temperature, and the battery float capacity is updated in accordance with the true age, as described above.

Also as described above, the passive operation parameters may be used to generate other battery status parameter such as probability of failure parameters or a midpoint voltage ratio parameter. An overall probability of failure parameter may be computed by taking the maximum of three probability of failure parameters. A first probability of failure parameter is generated based on the evolution of the float current with time, which float current is preferably corrected by taking into account the effect of true battery age and battery temperature on the float current. A second probability of failure parameter may be computed based on the true age, and a third may be calculated based on the initial discharge current rate. The highest of these three probabilities is used as the overall probability of failure to compare to a respective threshold.

A midpoint voltage ratio parameter may also be computed by comparing the string voltage to the midpoint string voltage (both passive measurements).

Any of these battery status parameters may be compared to one or more thresholds, which, when exceeded, can be used to take further action, such as the generation of minor or major alarm signals which may be used to transmit alarm signals or to disconnect equipment.

Battery State Machine

Figure 3:
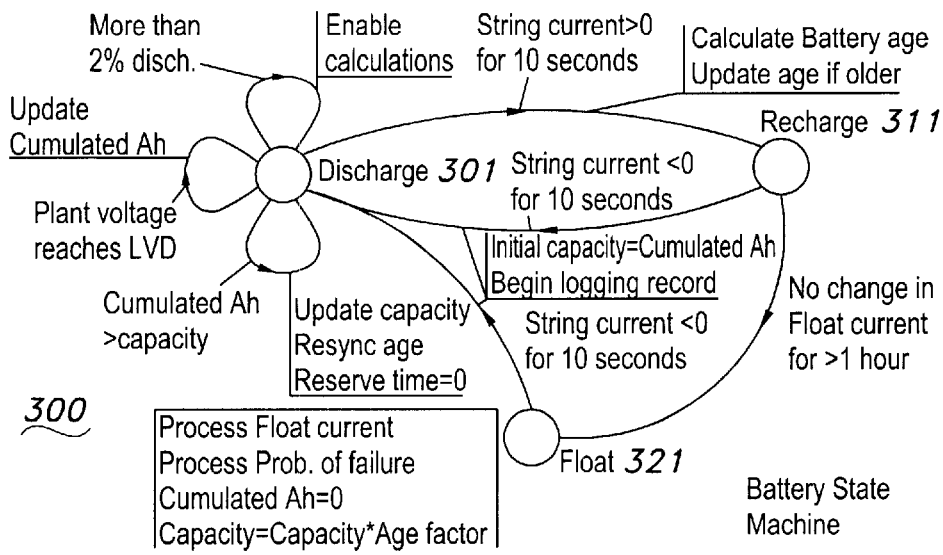
FIG. 3 is a state machine diagram illustrating the operation of the battery monitoring system of FIG. 1.

Referring now to FIG. 3, there is shown a state machine diagram 300 illustrating the operation of battery monitoring system 117 of FIG. 1. As will be appreciated, some of the previously described algorithms are performed continuously (permanently) by microcontroller 111 running application 112, whereas others are only executed during particular states of the battery (discharge, recharge, float). Therefore, a state machine process is used to identify which state the battery currently is in, as illustrated by diagram 300.

In each state, application 112 first searches to determine whether the transition conditions to switch to another state are met. If not, it executes whatever process must be performed during the current state and then exits.

In the discharge state 301 (battery current is negative), application 112 looks for the current to change polarity for more than 10 seconds to switch to the recharge state. If the current is still negative, it calculates the initial string current rate, the remaining capacity, and estimated reserve time on discharge. These variables will be used later by the alarm module 213 of FIG. 2A.

During this state, application 112 also checks particular conditions which help in realigning the system. First, the plant voltage reaching the Low Voltage Disconnect level means that the plant has exhausted its capacity; the estimated capacity is then realigned on the Ah cumulated during discharge. Second, the total of Ah cumulated during discharge exceeding the current predicted capacity means that the current capacity is below its real value and needs to be updated. The calculated battery age is also updated to realign the string parameters to the actual situation.

In recharge state 311 (battery current is positive), application 112 looks for the current to change polarity for more than 10 seconds to switch to the discharge state. If the current is still positive, it checks whether the float current has been stable for the last 90 minutes, in which case it switches to float state 321. If not, application 112 simply cumulates the Ah fed into the battery.

In float state 321 (float current is stable), application 112 looks for the current to change polarity for more than 10 seconds to switch to the discharge state. If the battery is still being floated, it processes the float current evolution and the corresponding probability of failure. Since the battery is now fully recharged, the cumulated Ah is reset and the current capacity updated with:

$$\text{Current capacity} = \text{Capacity} \cdot \text{Age factor} \tag{16}$$

The probability of failure therefore comes from three sources. First, age, where the probability of failure is zero below 80% of expected life, and raises to 100% at 120% expected life, as illustrated in FIG. 4, which contains a graph showing probability of failure versus true battery age. Second, float current, where the probability is zero if the float current has not risen above 200% of its initial value (when the battery was stated to be in float state 321), and raises to 100% when the float current has reached 400% of its initial value, as illustrated in FIG. 5, which contains a graph showing probability of failure versus float current.

Third, the initial discharge current rate generates a probability of failure of 0% above 0.9, increasing in a linear fashion to 100% at and below 0.7. The highest of these three probabilities is compared to a threshold preset by the user to generate an alarm.

Logging Memory

Battery monitoring system 117 also keeps a logging memory (either the same as or included in memory 111$a$), which is preferably backed up by a battery, and expandable from 128K to 512K bytes. In an embodiment, in order to optimize data logging and retrieval, logging memory 111$a$ is divided into 5 areas:

1. 16 Kbytes are allocated to battery discharge curves (described below in the section entitled "Battery Discharge Logging Module");
2. 5 Kbytes are allocated to temperature history (described below in the section entitled "Temperature History Module");
3. 0.25 Kbytes are allocated to the recording of plant and string maximum and minimum values;
4. 32 Kbytes are allocated to the alarm events for alarm logging (described below in the section entitled "Alarm Logging Module"); and
5. The remainder portion (74K to 458K, depending on the memory installed) is reserved for history logging (described below in the section entitled "History Logging Module");

This logging data is stored in a compact binary manner to further optimize the memory utilization. The computation and graphical capabilities of the laptop PC 120 are used to retrieve and analyze the events to obtain either plain text alarm messages or history graphs.

Battery Discharge Logging Module

One purpose for the logging is to provide the user all the battery information available during a discharge. This area of memory is filled with "discharge records", each representing a discharge cycle. The memory is dimensioned to be able to record up to three complete discharge cycles with four strings installed. Smaller systems or less deep discharges increase the number of records accordingly. For example, the number of logged records goes up to 18 for a 2 string plant seeing 30% depth discharges.

Each record is in turn divided in events. Recording an event is not triggered by time, but instead for every time a quantum of Ah is removed from the plant. This quantum is fixed to $1/256^{th}$ of the overall plant capacity, i.e 0.4%. In this manner, the maximum number of records for a complete discharge is always 256. This optimizes memory usage and naturally eliminates the problem of sampling rate found in time-based recording systems which either lead to redundancy, hence waste of memory, or to incomplete information. Since the time is recorded with each event, a time-based graph can be easily reconstructed during analysis by PC 120.

Figure 6:
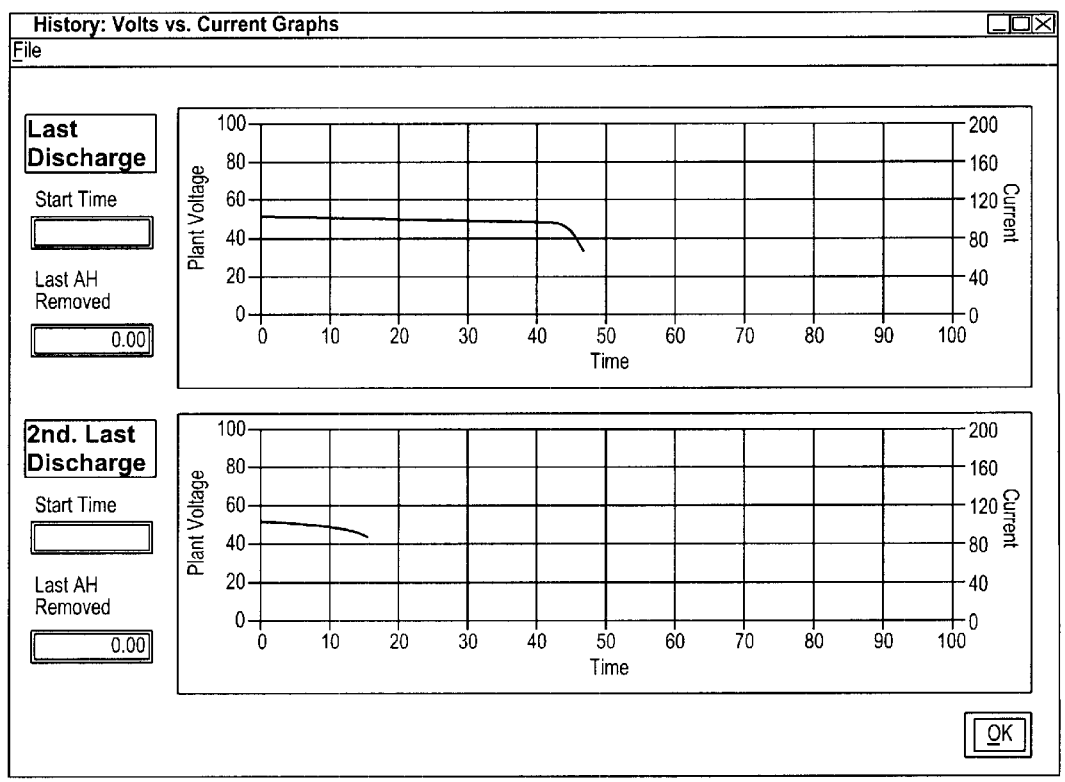
FIG. 6 is an exemplary computer display screen of the battery monitoring system of FIG. 1 showing a recent history of battery discharge curves.

Referring now to FIG. 6, there is shown an exemplary computer display screen of battery monitoring system 117, as displayed on a PC 120, showing a recent history of battery discharge curves 600. In an embodiment, the data recorded for each event includes:

Time (hour-min);
Plant (i.e., string) voltage;
Plant current; and
Ambient temperature.

For each string installed, the following data is recorded:

String current;
Pilot cell temperature;
Midpoint voltage; and
Percent capacity removed.

The date of the discharge is recorded once in the record header. The events can be stored in a spreadsheet format file to be displayed, analyzed, etc. by more powerful programs such as a spreadsheet.

Temperature History Logging Module

Temperature is an important factor in battery aging. It is therefore important to know what temperature profile the battery has encountered during its life, especially high temperatures. Since the battery aging process with temperature is cumulative, it is useless to record a full temperature history; a simple cumulation of hours spent at a particular temperature is adequate to provide enough information for further statistical analysis (average, standard deviation, etc.).

To efficiently use available logging memory, in one embodiment the two string sensors' temperatures are recorded in "bins" of 5° C. ranges, from 20° C. to 50° C. Two "bins" are added for temperatures <20° C. and >50° C., for a total of 8 "bins". Two additional bins are added to record the maximum and minimum temperatures encountered during the current year.

At every hour, the pilot and center cell temperatures of each string, as well as ambient temperature, are averaged and the counter of the corresponding bin is incremented by one. (The maximum number reached per year is 8760.) These counters and maximum/minimum data constitute the current year's temperature record or log. The consecutive yearly records are stored in the log memory 111$a$. Storing the temperature data by year provides a fine analysis over the battery life without accumulating redundant data, and can also indicate a trend. Thus, for example, in the present invention, 28 years of accumulated data can be stored in only 1K memory per string.

An independent record is done similarly for the ambient temperature. The graphical data retrieval panel shows a Bell-curve aspect which allows the user to obtain the yearly temperature profile at a glance (described in further detail with reference to FIG. 9, below).

Alarm Logging Module

Battery monitoring system 117 can record up to 2000 alarms entries, each of these containing from one to 17 simultaneous alarms, coming from the alarm and disconnect modules 213, 211. Each such alarms entry records the time and an image of the status of all alarms and disconnects into 16 bytes of data.

Alarm or disconnect setting and resetting are recorded in the same manner. The appearance or disappearance of an alarm or disconnect event immediately triggers a record in the alarm memory and a message to PC 120, if connected.

History Logging Module

The role of this record is to provide additional information on the behavior of the battery plant. For this purpose, a time sampling method is used to store an image of the battery plant at regular intervals. The sampling rate (in minutes) and the data recorded (date, time, voltage, current, temperature, etc.) is chosen by the user through a configuration panel via PC 120. This profile can be changed on the fly without losing any data. A "memory calculator" is included to calculate the time period that can be recorded with the amount of installed memory. The memory is organized as a ring, i.e. old data is erased by new data when the available memory has been filled.

No data is recorded for uninstalled strings. The user may choose a slow sampling rate to monitor routine plant activity, or a fast sampling to pinpoint a particular situation.

User Interface Software

The present invention includes a GUI which is used by a user to extract the logged data from battery monitoring system 117. This GUI has panels (windows) to permit the operator to view the battery node's data. These screens are selected from a standard windows menu format. They are the "Main Screen" which shows the expected battery life in years, the capacity at float, and estimated reserve time during a discharge. One of the most important values in this panel is the "Probability of Imminent or Sudden Failure." As described previously in the section entitled "Battery Module," this value is the worst case scenario between three computed probabilities related to the health of the battery strings: the true age, the initial discharge current rate, and the evolution of the float current.

The last Main Screen indication is the accumulated depth of discharge, which corresponds to how many Ah have been removed during a discharge of the battery string.

The "Configure Screens" are used to configure battery monitoring system 117 by sending data for various thresholds, alarm formulas, and battery dependent values (used in the battery capacity determination algorithm).

Figure 7:
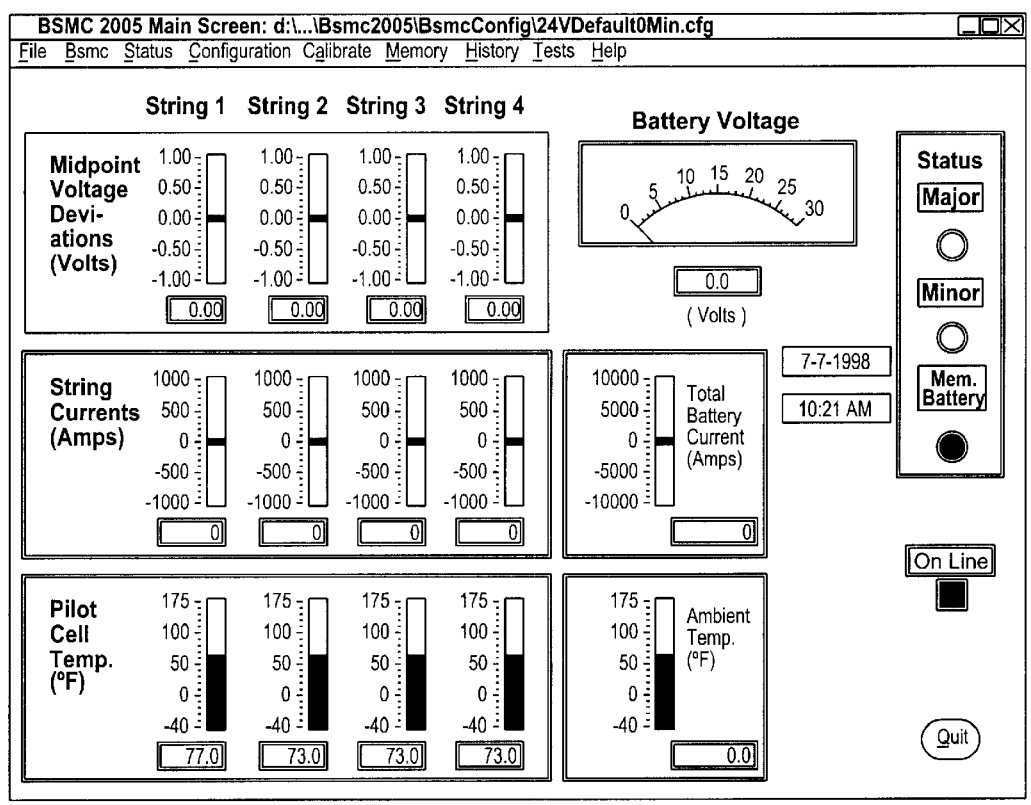
FIG. 7 is an exemplary computer display screen showing a status panel used with the battery monitoring system of FIG. 1.

Referring now to FIG. 7, there is shown an exemplary computer display screen showing a status panel 700 used with battery monitoring system 117. This status screen or panel shows power readings. Here the GUI displays the temperature differences, i.e., pilot to center cell differences and center to ambient differences, all of which have individually programmable alarm thresholds.

An "alarm events" panel, as shown in FIG. 13, retrieves the last 2000 alarm events from the data logging memory in the battery monitoring system 117. A "discharge curves" panel (FIG. 14) graphically displays the battery voltage, current vs. battery capacity, with respect to time for the last discharges. A "history screen" (FIG. 15) is a customer selectable logging of any of the 20 monitored signals at a logging interval from every minute to every hour in one-minute increments.

The following discussion covers primarily the status, incoming alarms, and event history panels. The status menu permanently displays an updated image of the main parameters of the battery plant (FIG. 7) and gives the user the option of choosing one of the following status screens through pull-down menus:

Temp Differences/Aux;
Voltages;
Temp Averages;
Temp Ambient;
Plant Deviations;
Disconnect status; or
Plant status.

Temperature Differences Panel

Referring now to FIG. 8, there is shown an exemplary computer display screen showing a temperature difference panel 800 used with battery monitoring system 117. This panel indicates the present differences in temperatures between various temperature sensors placed throughout the strings. These sensors measure ambient, pilot, and center cell temperatures. These measurements and the computed differences between the readings are used to trip alarms whose thresholds are configured in the configuration panels. This data can be used to determine if any difference is present. This type of data is used in predicting the battery life and to notify the operator of a potential problem.

Temperature Averages Panel

Figure 9:
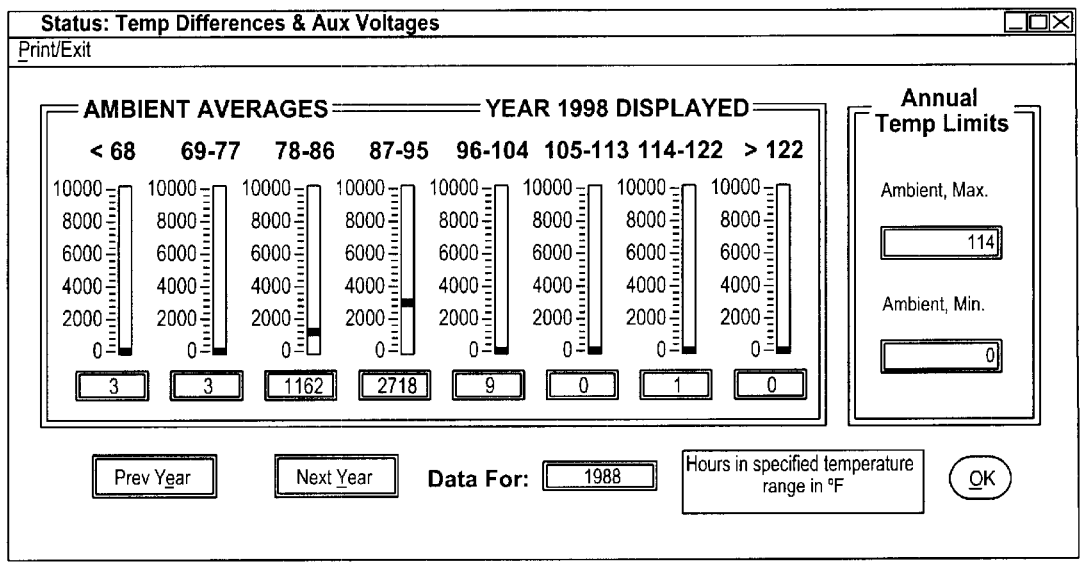
FIG. 9 is an exemplary computer display screen showing a temperature averages panel used with the battery monitoring system of FIG. 1.

Referring now to FIG. 9, there is shown an exemplary computer display screen showing a temperature averages panel 900 used with battery monitoring system 117. This is an informative screen in the GUI, and when selected it shows how many hours each string has been in any of eight temperature ranges. In an embodiment, the ranges are <69° F., 69° F. to 77° F., 78° F. to 86° F., 87° F. to 95° F., 96° F. to 104° F., 105° F. to 113° F., 114° F. to 122° F. and >122° F. Presenting the data in range bins tells much more about the condition of the batteries than just computing the average string temperature. This is because peaks that may be significant are eliminated by computing the average or even the median. For example, several hours spent at 115° F. will remain unnoticed if they are embedded in an average. By contrast, with the present invention, a peak temperature will be immediately located by simply looking at the graph. The graphs are color coded for each range. The first three are ideal ranges and are thus green; the next two are yellow; and the last three are red. The operator may also retrieve, when available, data for previous years for comparison and trend analysis. The Ambient Temperature Screen is also displayed in this way.

The Disconnects Panel

This panel displays the operating mode (permanently connected/latching/non-latching/ permanently disconnected/not installed), the required state of the contactor (energized/deenergized), and the actual contactor status (open/closed) from 4 of the 5 binary inputs. This feedback from the contactors is used by battery monitoring system 117 to verify that the disconnect is functioning. An alarm is generated should the disconnect fail to close properly. If the unit is configured for a latching style disconnect then the RESET button would become visible. This button is used to manually reconnect the string to the load after the battery node has performed a disconnect. The above discussion also applies to the low voltage Disconnect.

The Derivations Panel

Figure 10:
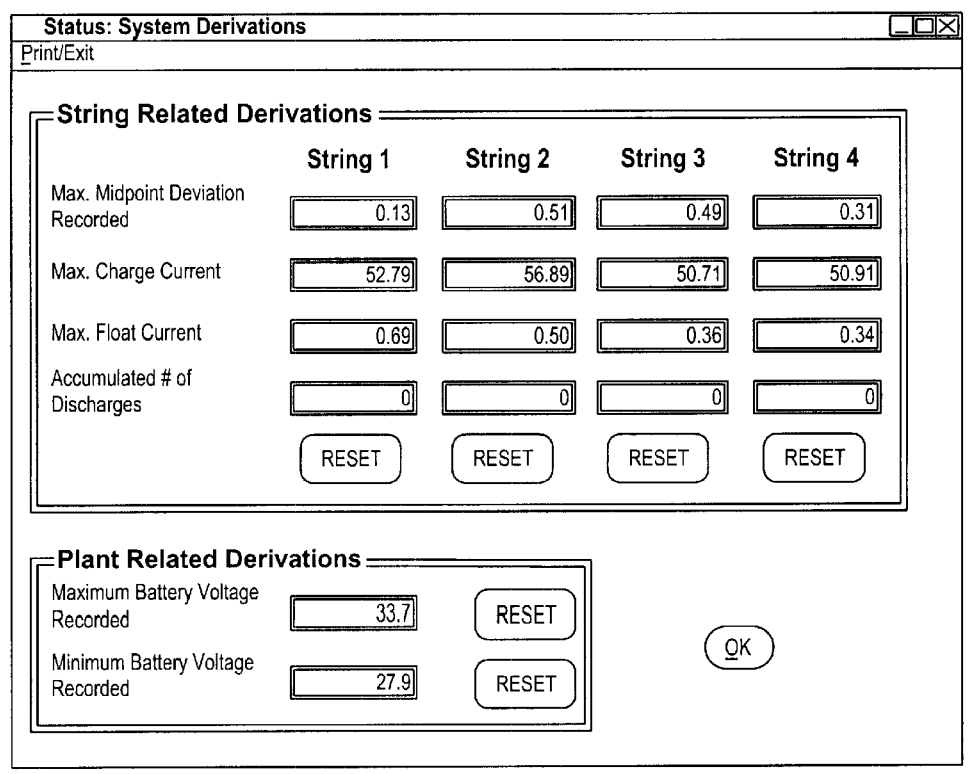
FIG. 10 is an exemplary computer display screen showing a system derivations panel used with the battery monitoring system of FIG. 1.

Referring now to FIG. 10 there is shown an exemplary computer display screen showing a system derivations panel 1000 used with battery monitoring system 117. This panel summarizes the string and plant related derivations. The string derivations shows the maximum midpoint deviation, the maximum charge current, maximum float current, and the accumulated number of discharges recorded in the log memory. A RESET button is also provided to reset these maximum readings back to zero.

The maximum midpoint deviation tells the operator which string has the largest deviation between the top and midpoint sections of a string. This data can be helpful in determining any potential shorts or opens in the batteries. The maximum charge current can indicate a failing string that is no longer being fully charged or is no longer capable of providing its full capacity. The maximum float current is a good indicator of battery charging condition. When viewed over the long run trends may begin to appear. This trend can be helpful in finding open or shorted batteries within a string. The accumulated number of discharges is used by battery monitoring system 117 in determining the expected life of the battery string. With regard to the battery plant, the max./min. battery voltages are simply helpful information.

Computed Values Panel

Referring now to FIG. 11, there is shown an exemplary computer display screen showing a plant status panel 1100 used with the battery monitoring system 117. This panel allows an operator to view the plant voltage, alarm LEDs, and graphs of midpoint voltages, string currents and pilot cell temperatures.

Alarm Panel

Referring now to FIG. 12, there is shown an exemplary computer display screen showing an alarm configuration panel 1200 used with battery monitoring system 117. FIG. 12 illustrates the method used to define the alarm conditions using the GUI. The configure major triggers screen shows a large matrix whose top headings are MAJOR OR, AND1, AND2, AND3, MINOR OR, AND1, AND2, AND3. These headings refer to types of alarm equations available. On the left side is a column of alarm thresholds that determine the various alarms. To choose an alarm, the user simply left-clicks on the radio-button which turns the blank square indicator into a filled square indicator. This selects the alarm. To set the battery monitoring system to use the alarm, a SET command is performed from the user menu on the main screen (FIG. 7). For example, to choose a major alarm whenever the battery voltage exceeds its configured threshold, the user would click on the button where MAJOR OR (column) and Maximum Battery Voltage (row) intersect.

To make Maximum Probability of Failure AND High Cell Temp create an alarm when both events occur simultaneously, the user clicks on the AND1 button where AND1 intersects with Max. Prob. of Failure and again where AND1 intersects with High Cell Temp. This is much easier than typing in the equation for each alarm and trying to remember which equations have already been entered.

This same method is used to choose the Minor and AUX. alarm triggers and the disconnects.

Referring now to FIG. 13, there is shown an exemplary computer display screen showing a latest alarms panel 1300 used with battery monitoring system 117. When alarms occur, there are two ways to find out which triggers caused the alarms. First, by right-clicking on the MAJOR LED on the Main Screen (FIG. 7).

The alarm log is the second way to retrieve alarms. It is attainable from the history-alarm events log in the main screens' pulldown menu. Both methods download the file from battery monitoring system 117 and bring up a screen indicating how many entries are in the log memory and the date and time that they started and ended.

Other Panels

Figure 14:
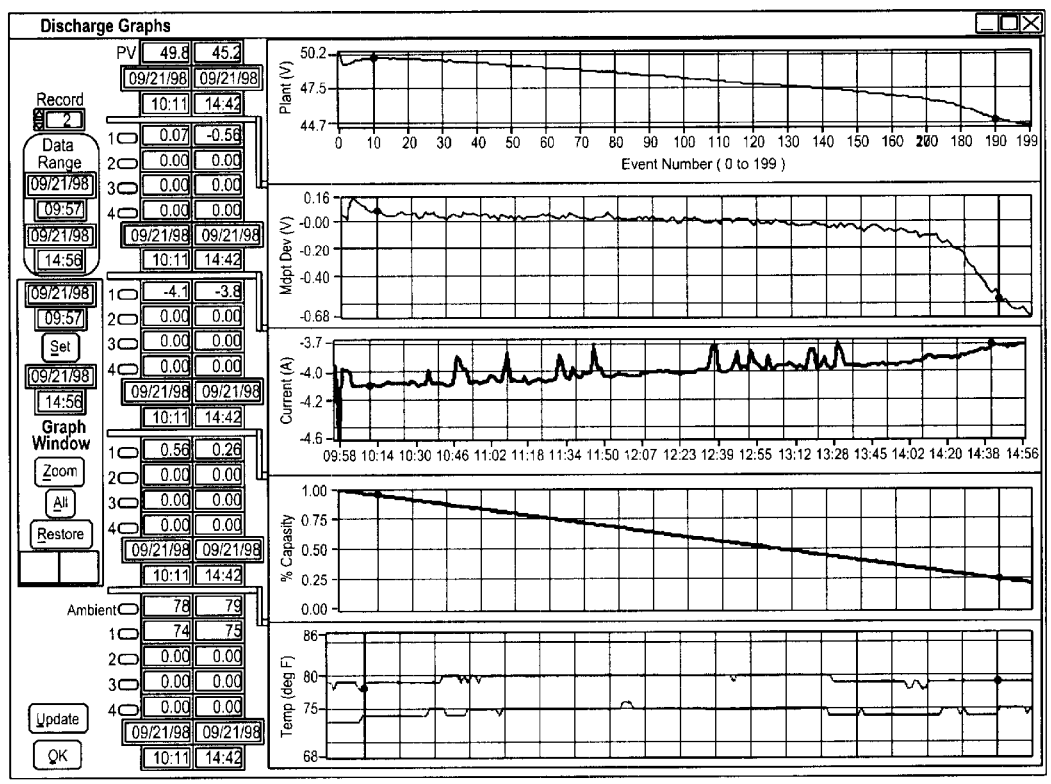
FIG. 14 is an exemplary computer display screen showing another set of battery discharge curves used with the battery monitoring system of FIG. 1.
Figure 15:
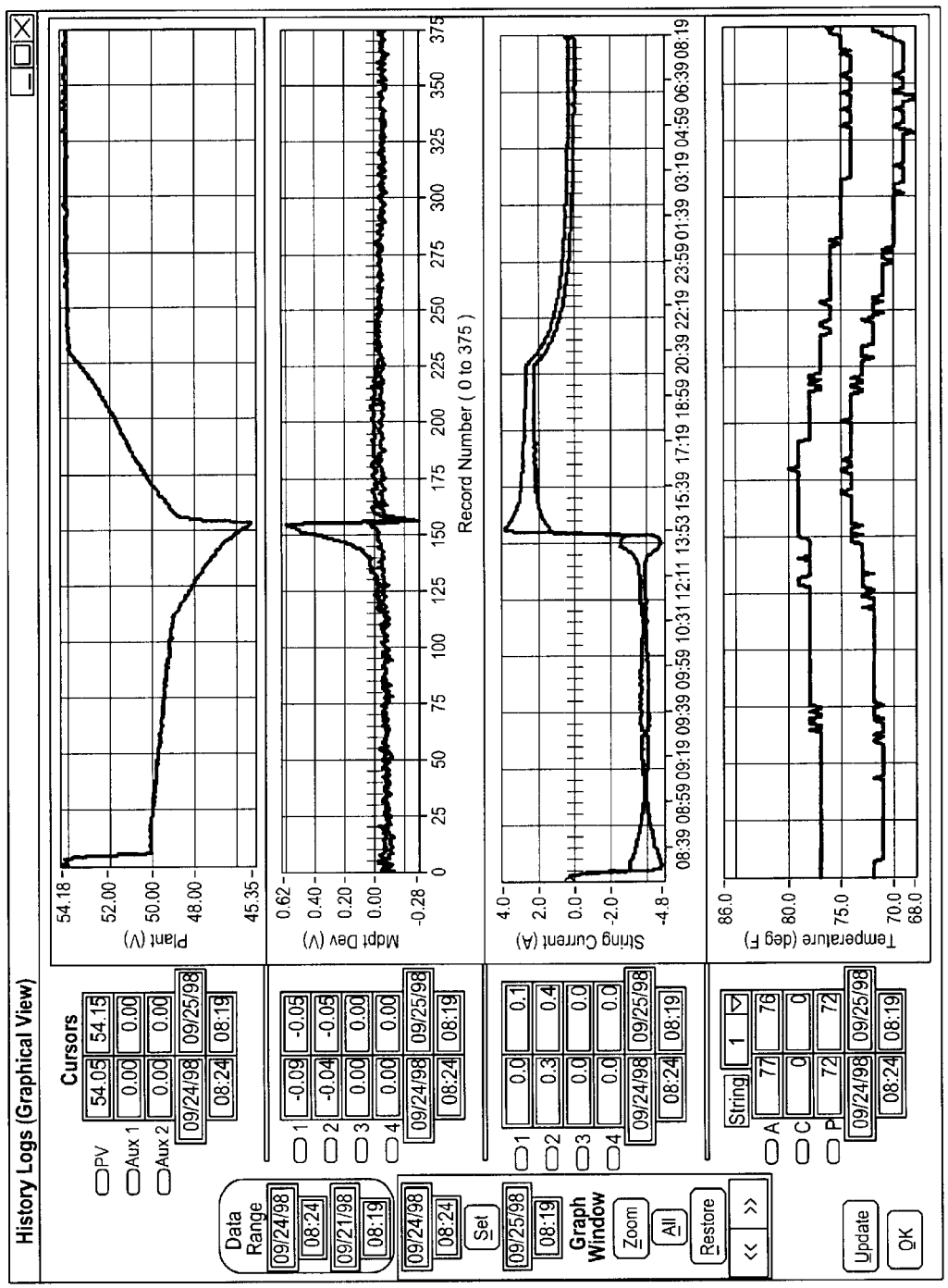
FIG. 15 is an exemplary computer display screen showing a graphical view of several historical parameter logs used with the battery monitoring system of FIG. 1.

Referring now to FIG. 14, there is shown an exemplary computer display screen showing a set of battery discharge curves 1400 which may be viewed by a user of PC 120 coupled to battery monitoring system 117. FIG. 15 is an exemplary computer display screen showing a graphical view of several historical parameter logs 1500 which may be viewed by a user of PC 120 coupled to battery monitoring system 117.

It will be understood that various changes in the details, materials, and arrangements of the parts which have been described and illustrated above in order to explain the nature of this invention may be made by those skilled in the art without departing from the principle and scope of the invention as recited in the following claims.

What is claimed is:

1. A system for monitoring performance of one or more batteries in a battery plant facility, the system comprising:
   (a) a set of sensors for each battery for measuring a plurality of battery operation parameters comprising the battery current, battery voltage, and internal battery temperature of each said battery; and
   (b) a processor that generates, for each battery, a plurality of battery status parameters comprising a true age parameter and a float capacity parameter, wherein:
      during a float period, the true age parameter is updated based on elapsed time corrected for battery temperature history and the float capacity is updated based on the most recent true age parameter;
      during a discharge period, the float capacity parameter is updated based on the evolution of plant voltage during the discharge; and
      after the discharge period and at the beginning of a subsequent float period, the true age parameter is updated based on the float capacity parameter determined during the discharge period.

2. The system of claim 1, wherein, after the discharge period and at the beginning of the subsequent float period, the float capacity parameter is updated based on the true age parameter after the true age parameter is updated.

3. The system of claim 1, wherein, during a float period, the true age parameter is periodically updated based on the elapsed time during a most recent elapsed time period, wherein the elapsed time is corrected for the average battery temperature history during the elapsed time period.

4. The system of claim 1, wherein, during a discharge period, the float capacity parameter is updated based on the evolution of plant voltage versus cumulated Ampere-hours, corrected for temperature and discharge rate.

5. The system of claim 4, wherein, during a discharge period, a plant float capacity parameter is calculated based on the previous battery float parameters and the evolution of plant voltage versus cumulated Ampere-hours, corrected for temperature and discharge rate, wherein each battery float capacity parameter is updated based on the plant float capacity parameter and the relative magnitude of the battery currents of each respective battery delivered during an initial portion of the discharge.

6. The system of claim 1, wherein the initial portion of the battery discharge is the first 5% of the battery discharge.

7. The system of claim 1, wherein the plurality of battery status parameters further comprise a remaining discharge time parameter which is repeatedly re-calculated, during a discharge period, based on the most recent battery float capacity parameter and cumulated Ampere-hours.

8. The system of claim 7, wherein the remaining discharge time parameter is corrected for temperature and rate of discharge.

9. The system of claim 1, wherein after the discharge period and at the beginning of the subsequent float period, the true age parameter is further updated to take into account the depth of the discharge during the discharge period and the total number of battery discharges.

10. The system of claim 1, wherein:
the battery current for a battery is a float current when the battery is in float mode; and
the plurality of battery status parameters further comprise a probability of failure parameter which is based on the evolution of the float current with time.

11. The system of claim 10, wherein the processor generates the probability of failure parameter based on the percentage change of the float current magnitude at the present time relative to the float current magnitude at a previous time period.

12. The system of claim 11, wherein the probability of failure parameter is corrected by taking into account the effect of true battery age and battery temperature on the float current.

13. The system of claim 1, wherein the plurality of battery status parameters further comprise a probability of failure parameter which is based on the true age parameter for the battery.

14. The system of claim 1, wherein the plurality of battery status parameters further comprise a probability of failure parameter which is based on the initial battery discharge current rate during a discharge.

15. The system of claim 1, wherein the plurality of battery status parameters further comprise an overall probability of failure parameter comprising the maximum of first, second, and third probability of failure parameters, wherein the first probability of failure parameter is based on the evolution of the float current with time, the second probability of failure parameter is based on the true age parameter for the battery, and the third probability of failure parameter is based on the initial battery discharge current rate during a discharge.

16. The system of claim 1, wherein each battery is a battery string comprising a plurality of series-connected battery cells.

17. The system of claim 16, wherein the one or more batteries comprise exactly four battery strings coupled in parallel in the battery plant.

18. The system of claim 16, wherein the battery operation parameters further comprise the midpoint string voltage for each battery string and the processor generates, for each battery, a midpoint to battery voltage ratio parameter, wherein the processor compares the midpoint to battery voltage ratio parameter to a threshold and generates an alarm signal in accordance with said comparisons.

19. The system of claim 18, wherein the processor is a microcontroller comprising a memory for storing battery discharge curves, battery temperature history, status thresholds, alarm events, and a history log, wherein the microcontroller runs a monitoring application program for generating the plurality of battery status parameters for each battery.

20. The system of claim 18, wherein the alarm signal is one of a signal used to trigger an alarm or a disconnect signal used to disconnect equipment powered by the batteries in the battery plant facility.

21. The system of claim 20, further comprising a user interface for allowing a user to set the status thresholds, means for transmitting the alarm signal to a remote location, and means for disconnecting the equipment in response to the disconnect signal.

22. The system of claim 18, wherein the processor compares each battery status parameter to both a respective minor and major threshold and generates, respectively, a minor and a major alarm signal in accordance with said comparisons, respectively, wherein the major thresholds are set so that a major alarm signal is generated when there is an actual or impending service-affecting failure in the batteries.

23. The system of claim 1, wherein the set of sensors comprise only passive sensors.

* * * * *